US010639679B2

(12) United States Patent
Deligianni et al.

(10) Patent No.: US 10,639,679 B2
(45) Date of Patent: May 5, 2020

(54) REMOVING A RESIDUAL PHOTO-MASK FENCE IN PHOTOLITHOGRAPHY

(71) Applicant: International Business Machines Corporation, Armonk, NY (US)

(72) Inventors: Hariklia Deligianni, Alpine, NJ (US); Bruce B. Doris, Slingerlands, NY (US); Eugene J. O'Sullivan, Nyack, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 287 days.

(21) Appl. No.: 15/477,416

(22) Filed: Apr. 3, 2017

(65) Prior Publication Data

US 2018/0286666 A1  Oct. 4, 2018

(51) Int. Cl.
*B08B 3/08* (2006.01)
*H01L 21/02* (2006.01)
*H01L 21/302* (2006.01)

(52) U.S. Cl.
CPC .................................. *B08B 3/08* (2013.01)

(58) Field of Classification Search
None
See application file for complete search history.

(56) References Cited

U.S. PATENT DOCUMENTS

| 6,024,886 A | 2/2000 | Han et al. |
| 6,281,078 B1 | 8/2001 | Chang et al. |
| 7,021,320 B2 | 4/2006 | Lee |
| 7,071,112 B2 | 7/2006 | Hsieh et al. |
| 7,482,262 B2 * | 1/2009 | Hong ............... H01L 21/76816 257/E21.079 |
| 7,920,042 B2 | 4/2011 | Lotfi et al. |
| 8,136,228 B2 | 3/2012 | Pentek et al. |
| 9,343,400 B2 | 5/2016 | Lee et al. |
| 9,411,234 B2 | 8/2016 | Liu et al. |
| 2004/0038540 A1 * | 2/2004 | Li ..................... H01L 21/31116 438/700 |

(Continued)

OTHER PUBLICATIONS

H. Tomita et al., "Photo Resist Stripping Using Novel Sulfuric/Ozone Process", IEEE International Semiconductor Manufacturing Symposium, 2001, pp. 199-202.

*Primary Examiner* — Shamim Ahmed
(74) *Attorney, Agent, or Firm* — Garg Law Firm, PLLC; Rakesh Garg; Joseph Petrokaitis

(57) ABSTRACT

A first material is filled during a semiconductor fabrication process in a space bound on at least one side by a fence formation created as a result of an etching operation. A solvent-removable material is deposited such that the solvent-removable material encapsulates at least that portion of the fence formation which is protruding from the structure such that a height of the fence formation exceeds a height of the structure. The portion of the fence formation which is protruding from the structure and a first portion of the solvent-removable material are removed by planarization. A second portion of the solvent-removable material is removed by dissolving in a solvent, the second portion remaining after removal by the planarization of the first portion of the solvent-removable material.

10 Claims, 7 Drawing Sheets

(56) References Cited

U.S. PATENT DOCUMENTS

| | | | |
|---|---|---|---|
| 2004/0192058 A1* | 9/2004 | Chu | H01L 21/0273 438/710 |
| 2010/0279505 A1* | 11/2010 | Yang | G03F 7/0035 438/689 |
| 2010/0311243 A1* | 12/2010 | Mao | H01L 27/222 438/694 |
| 2015/0340267 A1* | 11/2015 | Parker | H01L 21/763 257/506 |

* cited by examiner

REMOVING A RESIDUAL PHOTO-MASK FENCE IN PHOTOLITHOGRAPHY

TECHNICAL FIELD

The present invention relates generally to a method, system, and computer program product for removal of undesirable byproduct structures resulting from etching in photolithography. More particularly, the present invention relates to a method, system, and computer program product for removing a residual photo-mask fence in photolithography.

BACKGROUND

An integrated circuit (IC) is an electronic circuit formed using a semiconductor material, such as Silicon, as a substrate and by adding impurities to form solid-state semiconductor electronic devices (device, devices), such as transistors, diodes, capacitors, and resistors. Any reference to a "device" herein refers to a solid-state semiconductor electronic device unless expressly distinguished where used. Commonly known as a "chip" or a "package," an integrated circuit is generally encased in hard plastic, forming a "package." The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask or a photolithography mask is interchangeably referred to as a mask or a photo mask. A mask is usable for successfully manufacturing or printing the contents of the mask onto wafer. During the photolithographic printing process, radiation is focused through the mask and at certain desired intensity of the radiation. This radiation is usable to "dose" or add a material to a layer, "etch" or remove a material from a layer, or both. The focus and the dosing of the radiation has to be precisely controlled to achieve the desired shape and electrical characteristics on the wafer. A cut mask is a type of mask that is usable to cut or form a pattern in one or more layers of materials during a fabrication process.

A device generally uses several layers of different materials to implement the device properties and function. A layer of material can be conductive, semi-conductive, insulating, resistive, capacitive, or have any number of other properties. Different layers of materials have to be formed using different methods, given the nature of the material, the shape, size or placement of the material, other materials adjacent to the material, and many other considerations.

The illustrative embodiments recognize that the present methods and techniques for etching away material from a layer have an undesirable effect. For example, poor etch selectivity during etching, such as in using ion-beam etching on a photo-mask layer of a structure, some of the mask material will inevitably get removed in the process of etching. The redeposited material forms a fence-like formation around all or a part of the structure where etching was performed.

Often, the fence formation will remain standing above, or protruding beyond, a level of the structure, after the etching process has been completed, and follow-on remaining mask removal. Furthermore, the remaining photoresist mask is more likely to become hardened due to the heating effect in prolonged etching, especially when using high-energy etching conditions.

The illustrative embodiments recognize that a fence that is unintentionally created in this manner has undesirable effects on the performance of the structure. Therefore, a method for removing a residual photo-mask fence in the IBE etching process following the photolithography mask-creation step would be desirable.

SUMMARY

The illustrative embodiments provide a method, system, and computer program product. An embodiment includes a method that fills during a semiconductor fabrication process, in a space bound on at least one side by a fence formation, a first material, wherein the fence formation is created as a result of an etching operation using a photo-mask to form a structure. The embodiment deposits a solvent-removable material such that the solvent-removable material encapsulates at least that portion of the fence formation which is protruding from the structure such that a height of the fence formation exceeds a height of the structure. The embodiment removes by planarization, the portion of the fence formation which is protruding from the structure, and a first portion of the solvent-removable material. The embodiment removes by dissolving in a solvent, a second portion of the solvent-removable material, the second portion remaining after removal by the planarization of the first portion of the solvent-removable material. Thus, the embodiment enables a removal of the fence structures formed during IBE.

Another embodiment further stops the planarization at a layer of the structure. Thus, the embodiment enables a step of the removal process to stop such that another step of the fence removal can be completed without adversely affecting the structure.

In another embodiment, the layer of the structure is a hard mask layer associated with the structure. Thus, the embodiment defines a specific stopping point.

In another embodiment, the planarization comprises a chemical-mechanical planarization (CMP) process. Thus, the embodiment defines a specific process for a removal step.

Another embodiment further performs the etching operation such that some materials removed by the etching operation redeposit on at least one surface of the structure to form the fence formation, and wherein the etching operation creates the space bound on the at least one side by the fence formation. Thus, the embodiment defines a general problematic method that creates the fences that are to be removed.

In another embodiment, the etching operation is an ion-beam etching (IBE) operation, and wherein the some materials of the fence formation are hardened by heat produced in the IBE operation. Thus, the embodiment defines a specific problematic method that creates the fences that are to be removed.

In another embodiment, a plurality of fence formations is formed on a plurality of surfaces of the structure. Thus, the embodiment enables removal of more than one fence.

In another embodiment, the filling the space with the first material causes the first material to be filled at least up to the height of the fence formation. Thus, the embodiment defines a specific height of a material used in a step to remove the fences.

In another embodiment, the first material and the second material are interchangeable due to a property that is shared by the first material and the second material. Thus, the embodiment enables the interchangeability of some materials used in the steps to remove the fences.

In another embodiment, the first material is interchangeable with a material used in the photo-mask due to a property that is shared by the first material and the material used in the photo-mask. Thus, the embodiment enables the interchangeability of some materials used in the steps to remove the fences.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
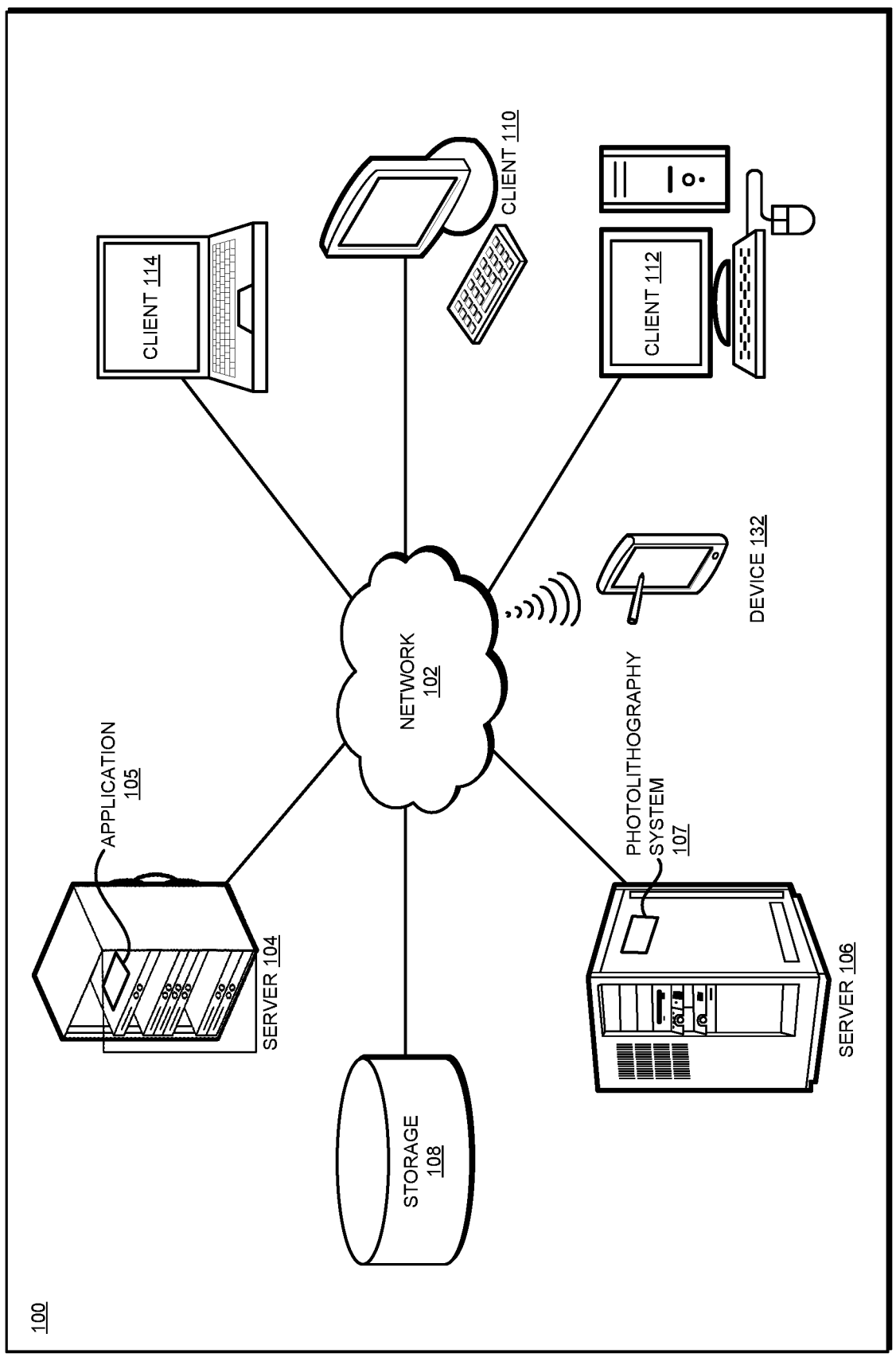
FIG. 1 depicts a block diagram of a network of data processing systems in which illustrative embodiments may be implemented.

The illustrative embodiments used to describe the invention generally address and solve the above-described problems and other problems related to removing a residual photo-mask fence following ion-beam etching (IBE). The illustrative embodiments provide a fabrication method that reduces or removes a fence formation resulting from an etching process.

An embodiment can be implemented as a software application. The application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to remove or reduce a fence that is formed after an ion-beam etching process has been performed on a photo-mask layer, as described herein.

For the clarity of the description, and without implying any limitation thereto, the illustrative embodiments are described using IBE as the etching process. Generally, because the ion beam is highly controllable for the angle at which the beam is incident on a layer, and other characteristics, presently, IBE is the preferred method for etching photo-masked material (or material with a photo-mask pattern). Those of ordinary skill in the art will be able to apply an embodiment to other fence-like formations formed as a result of IBE or other etching processes, or as a result of other processes during photolithography. Such applications of an embodiment are contemplated within the scope of the illustrative embodiments.

Furthermore, only for the clarity of the description, and without implying any limitation on the embodiments, an open area of the photo-mask layer over a structure is etched (along with some unintentional etching of the photo-mask itself), resulting in the undesirable fence. Those of ordinary skill in the art will be able to adapt an embodiment to remove fences formed by etching other materials or layers, and such adaptations are also contemplated within the scope of the illustrative embodiments.

Differently shaded portions in the two-dimensional drawing of the example structures, layers, and formations are intended to represent different structures, layers, and formations in the example fabrication, as described herein. The different structures, layers, and formations may be fabricated using suitable materials that are known to those of ordinary skill in the art.

A specific shape, location, position, or dimension of a shape depicted herein is not intended to be limiting on the illustrative embodiments. The shape, location, position, dimension, or some combination thereof, are chosen only for the clarity of the drawings and the description and may have been exaggerated, minimized, or otherwise changed from actual shape, location, position, or dimension that might be used in actual photolithography according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar devices in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in removing a residual photo-mask fence following IBE. A manner of removing or reducing unintentionally formed fence formations during etching is unavailable in the presently available methods. Thus, a substantial advancement of such devices or data processing systems by executing a method of an embodiment is in an improved fabrication method in which the existing etching methods continue to be applied as needed, while the resulting fence-like byproduct formations can be effectively removed or reduced such that their effects on the properties of the structure expected from the etching step becomes absent, negligible, or inconsequential.

The illustrative embodiments are described with respect to certain types of devices, electrical properties, structures, formations, layers orientations, directions, steps, operations, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and do not imply any limitations on the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
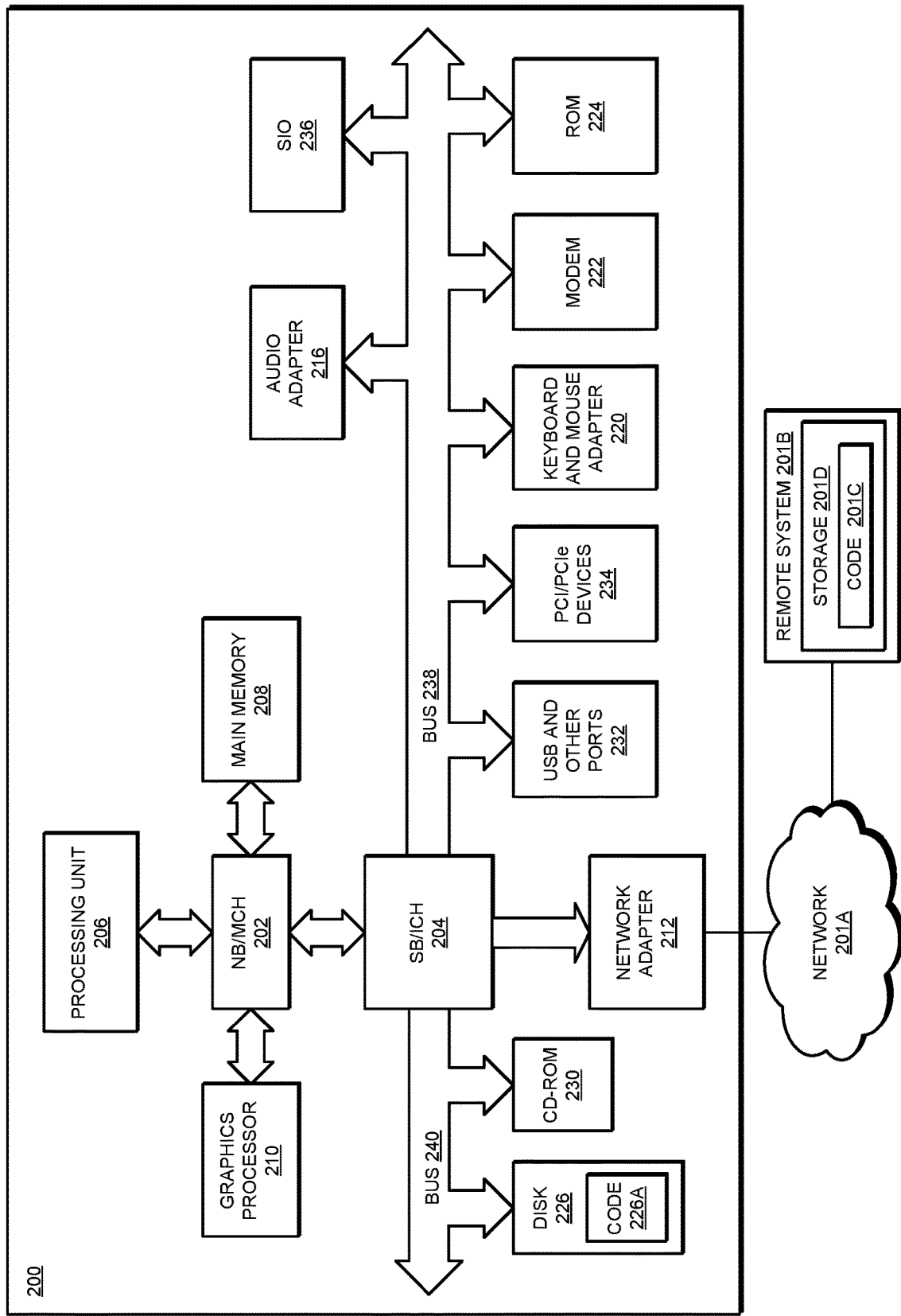
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a data processing device or a portable device usable for computing or communications purposes described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating a device, component, or structure, in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other data processing devices, such as mobile device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different computer-components or data processing devices attached to the fabric or architecture.

A communications unit may include one or more communications-capable devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
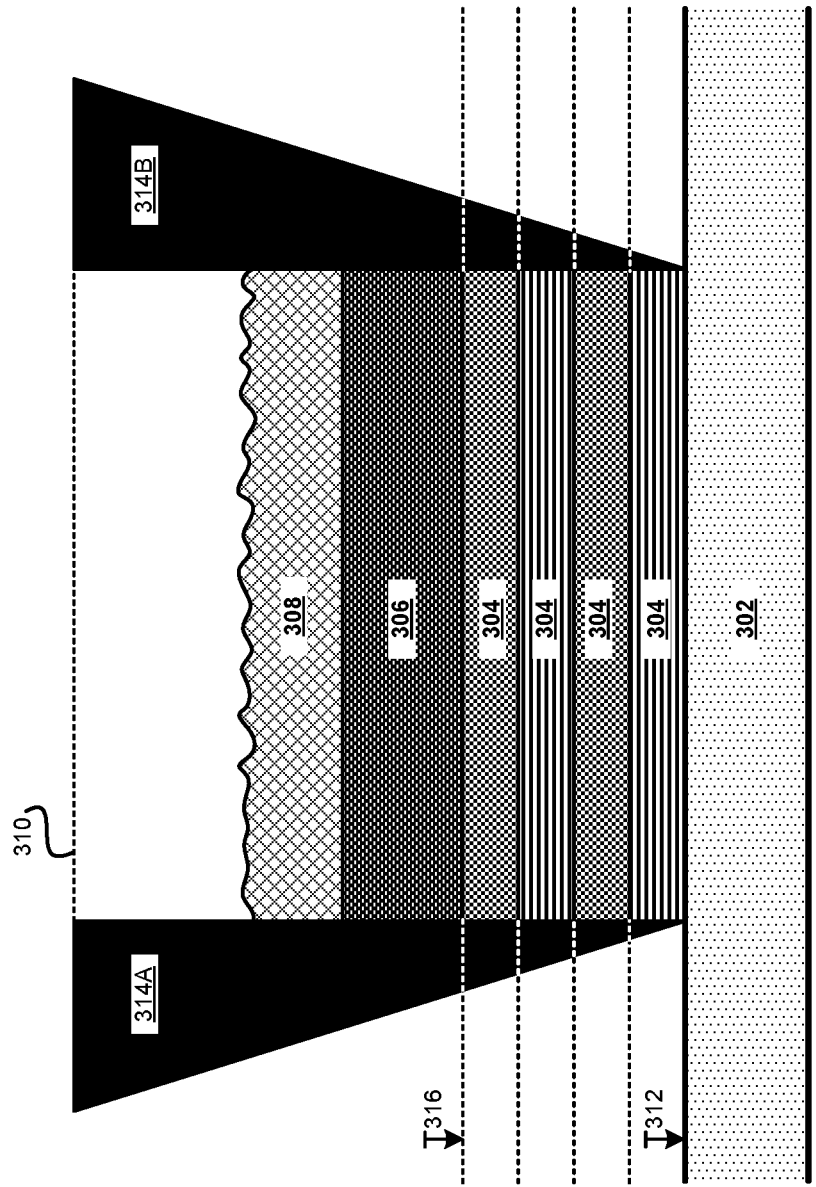
FIG. 3 depicts a block diagram of a fence formation resulting from an IBE process, which can be removed or reduced in accordance with an illustrative embodiment.

With reference to FIG. 3, this figure depicts a block diagram of a fence formation resulting from an IBE process, which can be removed or reduced in accordance with an illustrative embodiment. Application 105 in FIG. 1 interacts with fabrication system 107 to cause the ion-beam etching, as described herein. The depiction of FIG. 3 shows a post-ion-beam etching stage in a fabrication process of a hypothetical device. Substrate 302 extends beyond structure 304 as shown.

Suppose that substrate 302 has to be manipulated to form structure 304. Particularly, in the depicted example, layers 304 are formed on substrate 302. Layers 304 extend beyond the portion of layers 304 that is shown in this figure. Hard mask layer 306 is deposited or formed on such extended layers 304. Hard mask layer 306 also extends beyond the depicted portion of hard mask layer 306.

Photo-mask 308 is placed on hard mask 306 to protect the depicted portions of layers 304. The depicted portion of layers 304 form a useful structure in this hypothetical device. Photo-mask 308 is shaped in the shape of the depicted portion of layers 304, such that the depicted portion of layers 304 is protected from the etching process, as the extended portions of layers 304 and hard mask 306 are etched away.

A suitable photo-mask material is deposited up to a certain level, e.g., up to level 310. Level 310 is determined such that the photo-mask material of layer 308 is not etched away completely before the time the etching process etches the extended layers and reaches down to the desired level, e.g., level 312 in this example. Generally, at least some photo-mask material will remain in layer 308 when the etching completes, as shown. Remaining material in photo-mask 308 is removed by other known methods.

The etching redeposits the materials that are etched away in the form of a fence around all or some portion of the desired structure (depicted portions of layers 304). The fence is depicted in this two-dimensional example as formations 314A and 314B. Fence 314A-B may form one or more surfaces of structure 304.

As can be seen, fence formations 314A-B are not intended to be a part of structure 304. Fence formations 314A-B are a result of the etching process that is used to fabricate structure 304. Fence formations 314A-B are shown as tapered structures—which taper towards level 312—because the ion bean used for the etching is often incident on photo-mask 308 at an angle to minimize the interaction of the ion beam with structure 304. The angle of incidence of the ion beam is responsible for the tapering of formations 314A-B.

Fence formations 314A-B are undesirable, unintended, and adversely affect the electrical characteristics of structure 304. Fence formations 314A-B should be removed from above structure 304, e.g., at least up to at least level 316 in this example, and preferably all the way to level 312. By removal of fence formations 314A-B at least up to level 316, the adverse effects of fence formations 314A-B are sufficiently mitigated such that even if fence formations 314A-B remain from level 316 to level 312, the remainder's effect on the electrical properties of structure 304 is negligible.

Figure 4:
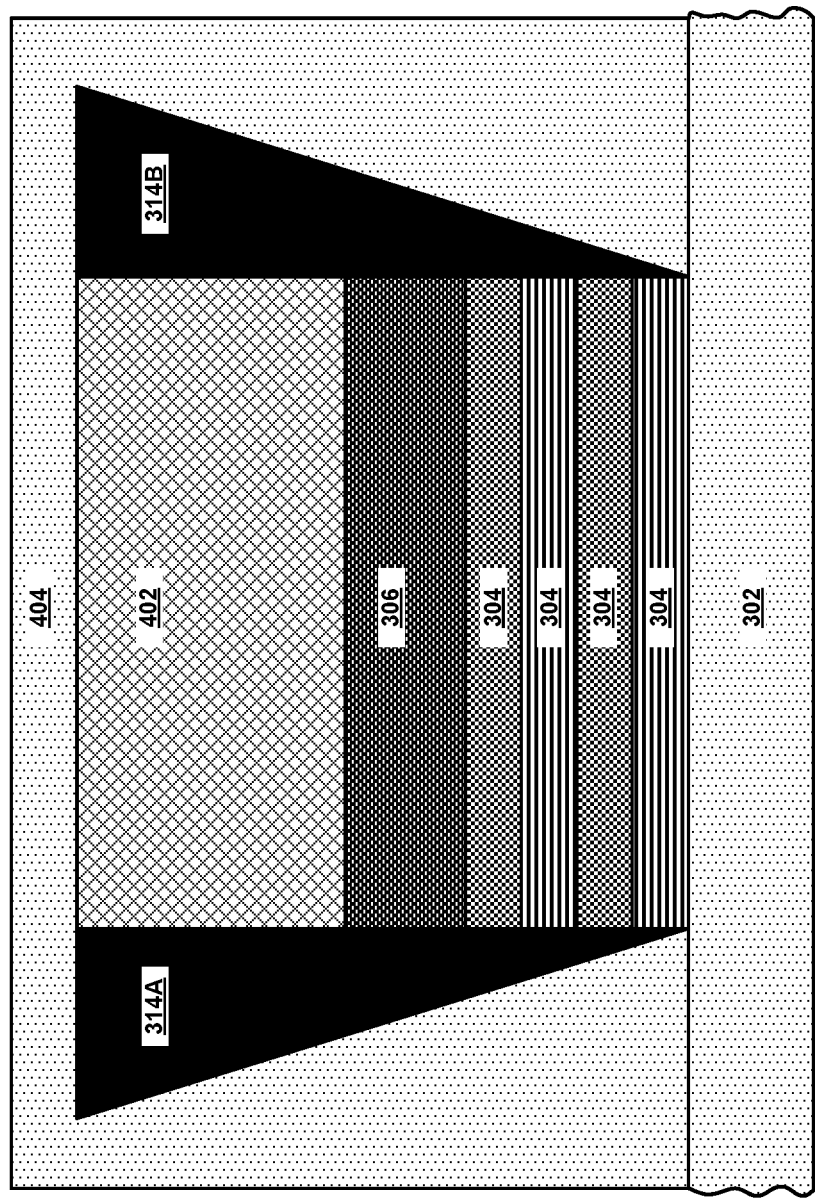
FIG. 4 depicts an example portion of a process for removing a residual photo-mask fence in photolithography in accordance with an illustrative embodiment.

With reference to FIG. 4, this figure depicts an example portion of a process for removing a residual photo-mask fence in photolithography in accordance with an illustrative embodiment. Substrate 302, structure 304, hard mask 306, and fence formations 314A-B are produced from an etching process, as described with respect to FIG. 3.

An embodiment, such as an embodiment implemented in application 105 in FIG. 1, deposits a first type of photo-mask material 402 at the location of photo-mask 308 in FIG. 3. As a non-limiting example, material 402 may be the same as or similar to the material of photo-mask 308. As a non-limiting example, material 402 may be deposited up to a height of fence formations 314A-B, as shown, but can be lower or higher than the height of fence formations 314A-B.

The embodiment further depicts a second material 404 to completely cover fence formations 314A-B. The complete coverage of material 404 can be thought of as an encasing of formations 314A-B, hard mask 306, and structure 304 in material 404. Material 404 is a solvent strippable material.

In one embodiment, material 404 may be a planarizing material. In another embodiment, material 404 may also be a photo resist material.

Furthermore, materials 402 and 404 can be the same or different materials depending on the particular implementation. For example, in one embodiment, the step of depositing material 402 is omitted, and material 404 is filled over any remaining photo-mask material 308 between formations 314A-B as well.

Figure 5:
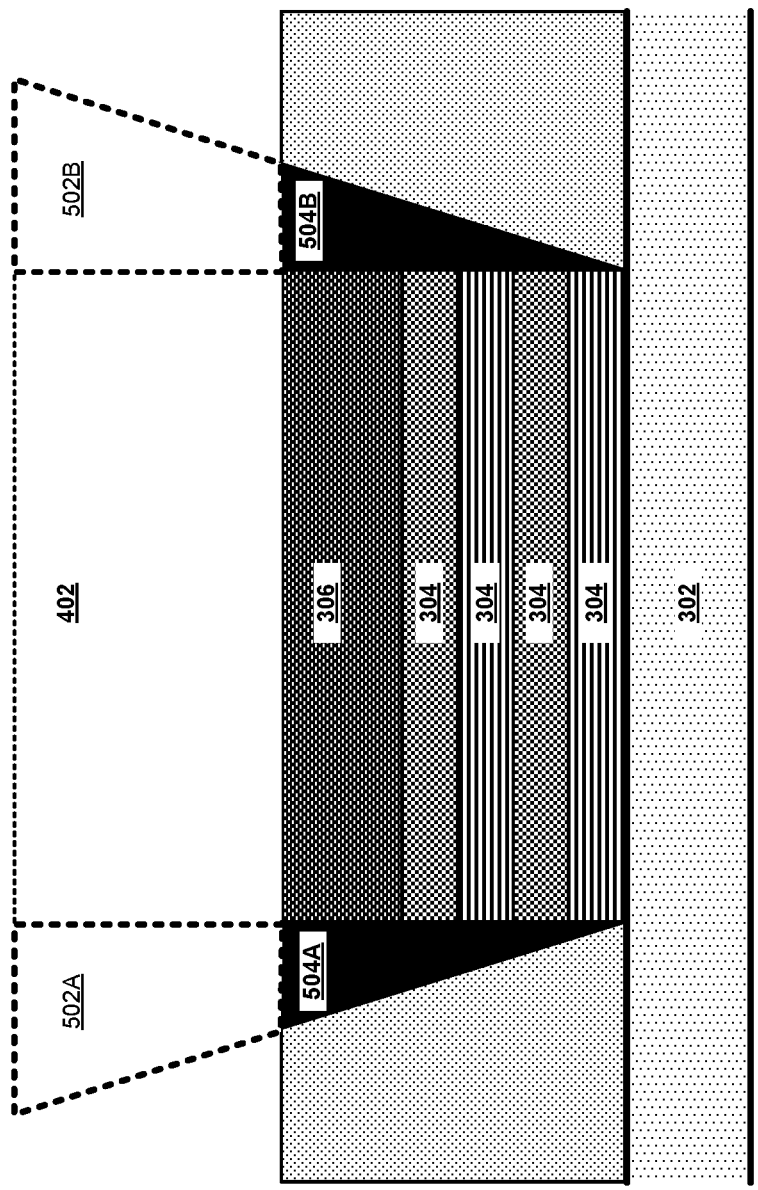
FIG. 5 depicts another example portion of a process for removing a residual photo-mask fence after IBE in accordance with an illustrative embodiment.

With reference to FIG. 5, this figure depicts another example portion of a process for removing a residual photo-mask fence after IBE in accordance with an illustrative embodiment. Substrate 302, structure 304, hard mask 306, and material 404 are as described with respect to FIG. 4.

A chemical-mechanical planarization (CMP) process removes all materials above structure 304. Particularly, the CMP process removes portion 502A of fence formation 314A, portion 502B of fence formation 314B, and material 402 therebetween. In one embodiment, the CMP process is stopped at hard mask layer 306 as shown.

The portions, materials, and structures depicted with dotted lines are removed by the CMP process. The effect of portions 502A-B on an electrical performance of structure 304 is adverse and significant. The CMP process removes portions 502A-B, thereby removing or significantly reducing such adverse effects. If portions 504A and 504B formations 314A and 314B, respectively, exist around hard mask layer 306 and around structure 304 below hard mask layer 306, such portions 504A-B remain encased in remaining material 404.

Figure 6:
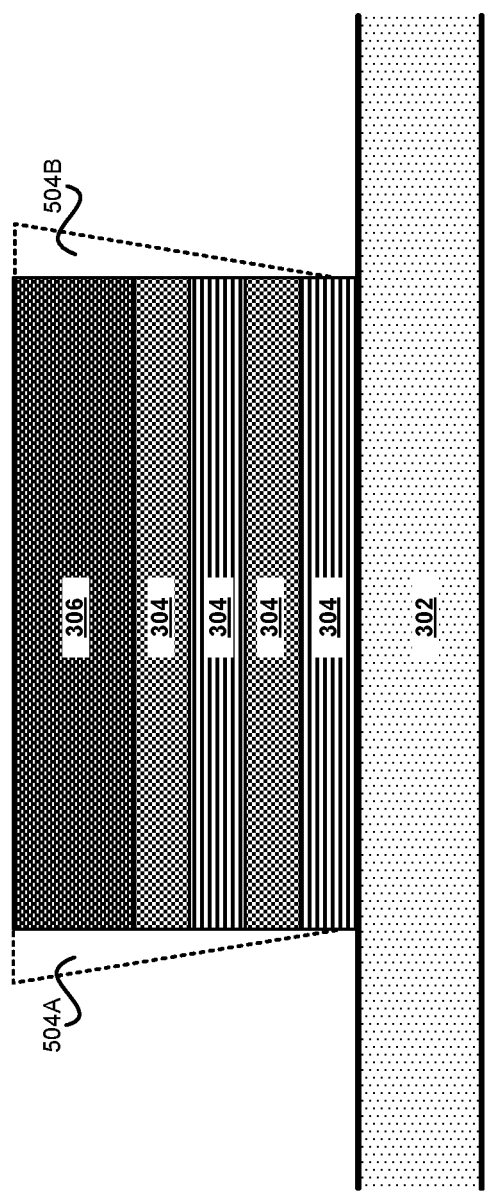
FIG. 6 depicts another example portion of a process for removing a residual photo-mask fence in photolithography in accordance with an illustrative embodiment.

With reference to FIG. 6, this figure depicts another example portion of a process for removing a residual photo-mask fence in photolithography in accordance with an illustrative embodiment. Substrate 302, structure 304, hard mask 306, and fence portions 504A-B are as described with respect to FIG. 5.

A solvent compatible with material 404 is used to remove remaining material 404 depicted in FIG. 5. The removal of remaining material 404 by the solvent leaves structure 304 intact. If portions 504A-B existed in FIG. 5, in some cases—depending on the material composition of portions 504A-B, the solvent may also remove all or some of fence portions 504A-B. Even if all or some materials of portions 504A-B remain associated with structure 304, the effect of portions 504A-B on an electrical performance of structure 304 is negligible.

Figure 7:
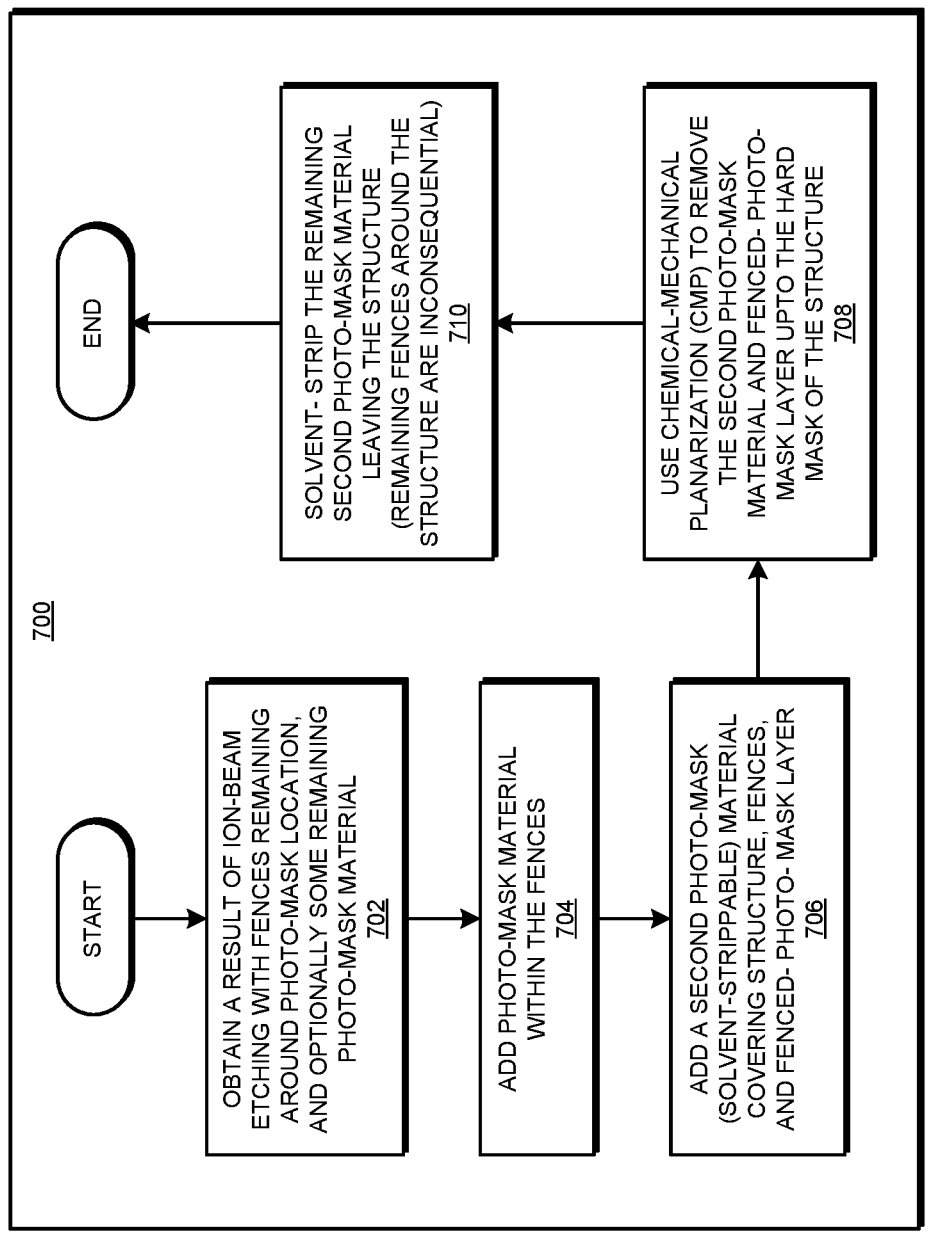
FIG. 7 depicts a flowchart of an example process for removing a residual photo-mask fence in photolithography in accordance with an illustrative embodiment.

With reference to FIG. 7, this figure depicts a flowchart of an example process for removing a residual photo-mask fence in photolithography in accordance with an illustrative embodiment. Process 700 can be implemented in application 105 in FIG. 1.

The application obtains a structure resulting from etching of a photo-mask (block 702). The etching results in a fence formation on at least one surface of the structure. Optionally, some photo-mask material may also remain with the fence formation after the etching.

The application adds a photo-mask material relative to the fence formation (block 704). If the fence formation creates a volumetric space or if more than one fence formations are present, the material added in step 704 occupies the volumetric space or the space between the plurality of formations, as the case may be. Furthermore, the material added in step 704 may be the same or different from the photo-mask material originally used for the photo-mask.

The application adds a second material such that the second material covers the structure, the fence formation(s), and any fenced in material added in step 704 (block 706).

The second material, which is added in step 706 is a solvent strippable material, i.e., a material that is removable by using a non-thermal and non-mechanical removal by dissolving the second material in a compatible solvent. In one embodiment, the material added in step 704 and the material added in step 706 are the same.

The application uses a chemical-mechanical planarization process to remove the second material and any fenced-in material from step 704, up to a designated height (block 708). The CMP process of step 708 also removes those portions of the fence formations that are above the designated height. In one embodiment, the designated height is a surface of a hard mask layer associated with the structure.

The application removes any remaining second material by using the compatible solvent on such remaining second material (block 710). The application ends process 700 thereafter. The solvent-removal of the remaining second material does not interfere with the structure. If any portion of the fence formations remain at or below the designated height, such remaining fence portions have negligible effect on the electrical performance of the structure.

Thus, a computer implemented method, system or apparatus, and computer program product are provided in the illustrative embodiments for removing a residual photo-mask fence in photolithography and other related features, functions, or operations. Where an embodiment or a portion thereof is described with respect to a type of mobile device, the computer implemented method, system or apparatus, the computer program product, or a portion thereof, are adapted or configured for use with a suitable and comparable manifestation of that type of mobile device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
    filling during a semiconductor fabrication process, in a space bound on at least one side by a fence formation, a first material, wherein the fence formation is created as a result of an etching operation using a photo-mask to form a structure;
    depositing a solvent-removable material such that the solvent-removable material encapsulates at least a portion of the fence formation which is protruding from the structure such that a height of the fence formation exceeds a height of the structure;
    removing by planarization, the portion of the fence formation which is protruding from the structure, and a first portion of the solvent-removable material; and
    removing by dissolving in a solvent, a second portion of the solvent-removable material, the second portion remaining after removal by the planarization of the first portion of the solvent-removable material.

2. The method of claim 1, further comprising:
    stopping the planarization at a layer of the structure.

3. The method of claim 2, wherein the layer of the structure is a hard mask layer associated with the structure.

4. The method of claim 1, wherein the planarization comprises a chemical-mechanical planarization (CMP) process.

5. The method of claim 1, further comprising:
performing the etching operation such that some materials removed by the etching operation redeposit on at least one surface of the structure to form the fence formation, and wherein the etching operation creates the space bound on the at least one side by the fence formation.

6. The method of claim 1, wherein the etching operation is an ion-beam etching (IBE) operation, and wherein the some materials of the fence formation are hardened by heat produced in the IBE operation.

7. The method of claim 1, wherein a plurality of fence formations is formed on a plurality of surfaces of the structure.

8. The method of claim 1, wherein the filling the space with the first material causes the first material to be filled at least up to the height of the fence formation.

9. The method of claim 1, wherein the first material and the second material are interchangeable due to a property that is shared by the first material and the solvent-removable material.

10. The method of claim 1, wherein the first material is interchangeable with a material used in the photo-mask due to a property that is shared by the first material and the material used in the photo-mask.

\* \* \* \* \*